United States Patent [19]

Persson

[11] Patent Number: 5,864,259
[45] Date of Patent: Jan. 26, 1999

[54] MEASURING LINE FOR A COAXIAL CONDUCTOR FOR DETERMINING ENERGY THROUGHFLOW AND STANDING WAVE RATIOS

[75] Inventor: Gunnar Erik Persson, Spånga, Sweden

[73] Assignee: LG Products AB, Solna, Sweden

[21] Appl. No.: 836,637

[22] PCT Filed: Nov. 15, 1995

[86] PCT No.: PCT/SE95/01359

§ 371 Date: Jun. 3, 1997

§ 102(e) Date: Jun. 3, 1997

[87] PCT Pub. No.: WO96/16337

PCT Pub. Date: May 30, 1996

[30] Foreign Application Priority Data

Nov. 17, 1994 [SE] Sweden .................................. 9403985

[51] Int. Cl.$^6$ ...................................................... H01P 5/18
[52] U.S. Cl. ............................................ 333/115; 324/632
[58] Field of Search .................................. 333/109, 115; 324/632, 637, 638, 627, 628

[56] References Cited

U.S. PATENT DOCUMENTS

| 4,211,911 | 7/1980 | Dehn ................................. 333/109 X |
| 4,859,971 | 8/1989 | Edwards et al. ..................... 333/109 |
| 4,990,858 | 2/1991 | Garner ................................ 324/639 |
| 5,325,064 | 6/1994 | Leanes et al. ....................... 333/109 |

FOREIGN PATENT DOCUMENTS

| 1 516 948 | 10/1969 | Germany . |
| 4-236362 | 8/1992 | Japan . |
| WO 93/21667 | 10/1993 | WIPO . |

*Primary Examiner*—Paul Gensler
*Attorney, Agent, or Firm*—Young & Thompson

[57] ABSTRACT

A measuring line for a coaxial conductor for determining energy throughflow and standing-wave ratio, comprising two coaxial connectors (2) having an impedance adapted for a coaxial conductor; an intermediate hollow conductor comprising an inner conductor (3) connected to the center conductor of the coaxial connectors and which is matched with that impedance; a directional coupler in the hollow conductor for taking-out two electric signals each corresponding to a respective propagation direction of electric waves between the coaxial connectors; and a detector circuit for respective electric signals. The directional coupler comprises a single directional coupler (4) which is mounted within the hollow conductor and parallel with its inner conductor (3) and which has symmetrically disposed branch lines (8) which are drawn through openings (9) in a wall of the hollow conductor and each of which extends to a respective strip conductor in a circuit board (10) mounted externally of the wall.

7 Claims, 5 Drawing Sheets

MEASURING LINE FOR A COAXIAL CONDUCTOR FOR DETERMINING ENERGY THROUGHFLOW AND STANDING WAVE RATIOS

The present invention relates to a measuring line, or test line, that can be coupled to a coaxial conductor. More specifically, the invention relates to a measuring line, or test line as described hereinafter.

Such measuring lines are often used in connection with antenna-connected conductors, e.g. in mobile telephony systems, intended for the UHF range. The transmitted energy is often comprised of several different carrier waves which have a mutual radio-channel spacing and which are intended for transmission on one and the same antenna, and consequently measuring of the composite power is of interest, despite being able to measure the transmission power of each modulated carrier wave per se. The standing-wave ratio is measured and monitored for the composite power, so as to be able to check antenna function among other things, since faults in an antenna function will normally result in mismatching noticeable by reflections, this mismatching immediately having a marked effect on the standing-wave ratio.

Measuring lines of the kind defined in the introduction and capable of being connected to a coaxial conductor or line with the aid of conventional coaxial contacts are known to the art, wherein the microwave energy is conducted through a hollow conductor which includes an inner conductor that is connected to the centre conductor of the coaxial connections and which has overall the same impedance as the coaxial conductor, e.g. an impedance of 50 ohms.

In view of the high powers that occur (upwards of 1 kW), the hollow conductor must have a careful configuration. A typical type is the so-called slab line, which is a type of TEM conductor and consists of a centre conductor placed between two parallel surfaces which together with narrower side surfaces and end surfaces define a flat, box-like configuration. In the case of one known construction, a directional coupler is located on each of said sides. The directional couplers are earthed at respective opposite ends via a matching resistor, whereas the non-earthed ends are each coupled to a respective measuring device, whereby the ratio between the output powers each representing a respective propagation direction can be measured and the standing-wave ratio can be calculated in voltage measurements (VSWR).

One object of the present invention is to provide a measuring device of the aforesaid kind which can be produced more cheaply and more simply. Another object of the invention is to provide in said device room for a measuring probe, a so-called test coupler. When wishing to make a complete analysis of what is transported in a coaxial conductor, it has hitherto been necessary to include a further measuring path, with the additional complexity and risk of error that this includes. It is difficult to provide room for more than two coupling conductors in a hollow conductor of the aforesaid kind, one on each side of the main conductor between the broad surfaces of the "box".

The aforesaid objects and advantages afforded by the invention are achieved by arranging in the hollow conductor solely one single directional coupler conductor which has symmetrically disposed transverse branch lines which are drawn through openings in a wall of the hollow conductor and each of which extends to a respective adapted conductor in a circuit board mounted externally of said wall, wherein the directional coupler conductor within the cavity and the lines or conductors on the circuit board have mutually matched impedances. Using circuit board technology, it is therewith possible to achieve the necessary precision much more cheaply and much more simply than can be achieved with conventional workshop practice.

The directional coupler conductor will preferably have a higher impedance than the hollow conductor, wherein an upper limit is set for reasons of mechanical stability because a high impedance means a narrow or slender directional coupler conductor and because a narrow directional coupler is unable to cope without the support of a dielectric material, which would result in impaired directivity. The length of the directional coupler is contingent on the wavelength used and will preferably be about one-quarter of a wavelength. When the hollow conductor concerned has an impedance of 50 ohms, the directional coupler will preferably have an impedance of 60–90 ohms, and preferably an impedance of about 75 ohms. An attenuating circuit is preferably also placed immediately after the hollow conductor outlet. When the directional coupler has a coupling effect of 35–55 dB and with an attenuation of 10–20 dB in a well-adapted attenuation circuit, the reflection from following essentially matched but not necessarily fully linear measuring circuits will be so negligible that the intermodulation phenomenon on the signals transmitted in the hollow conductor will become negligibly small.

In order for such a system to function, it is necessary for the terminal connections to the directional coupler to be particularly well adapted with regard to the fact that a reflected wave will give an error contribution to the measurement of the opposite propagation direction. A particular advantage afforded by the invention is therefore that as large a part as possible of the termination sensed by the ends of the directional coupler is placed in a circuit board, said construction enabling reproducible and inexpensive series manufacture, in the preferred embodiment using microstrip technology. Strip line techniques and similar techniques may also be used. The output signal is thereafter conveniently amplified prior to being passed to a voltage-controlled attenuation circuit upstream of a detector diode, the detector signal of which is amplified and passed through a lowpass filter that has a relatively long time constant (e.g. 0.2–2 s.), wherein the filtered signal is fed back to the voltage-controlled attenuation circuit and constitutes a measurement of the captured power in a logarithmic scale.

Such an array of attenuation circuits, amplifier, voltage-controlled attenuation circuit, lowpass filter, etc., is thus connected to each end of the directional coupler. One of these ends will deliver a signal corresponding to the forwardly directed power in the measuring line, while the other end will produce a signal corresponding to the reflected power. The standing-wave ratio is then obtained as $$VSWR = (1 + \sqrt{(P_r/P_i)})/(1 - \sqrt{(P_r/P_i)})$$

where $P_i$ is the incoming power and $P_r$ is the reflected power.

In the case of a preferred embodiment, each of these power signals is passed to a respective A/D converter and is there forwarded to a calculating circuit, which may include alarm outputs, which are activated upon the occurrence of excessively high standing-wave ratios, indicating instruments, etc. It is beneficial to mount these process circuits on a circuit board in one and the same unit, for instance on the opposite side of the hollow conductor in relation to the circuit board to which the directional coupler is connected.

The invention will now be described in more detail with reference to a non-limiting embodiment thereof and also with reference to the accompanying drawings.

FIG. 5B is a schematic sectional view of the used circuit board, which has four conductive surfaces or planes.

Figure 5A:
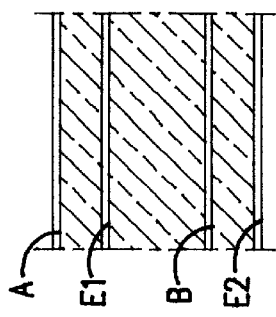
FIG. 5A illustrates part of a circuit board having a matched attenuation circuit which also transforms the impedance.
Figure 5A:
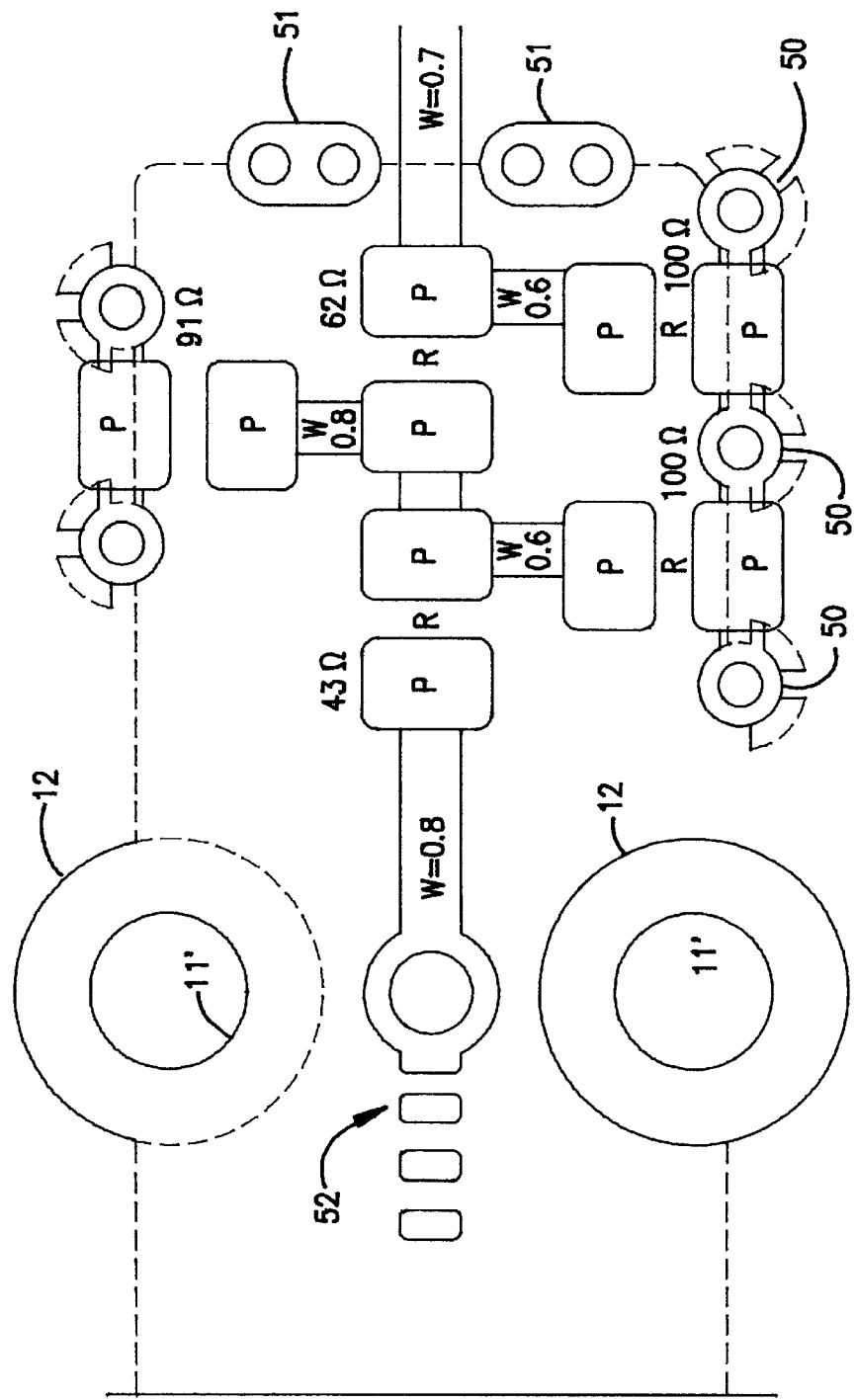
Figure 6A:
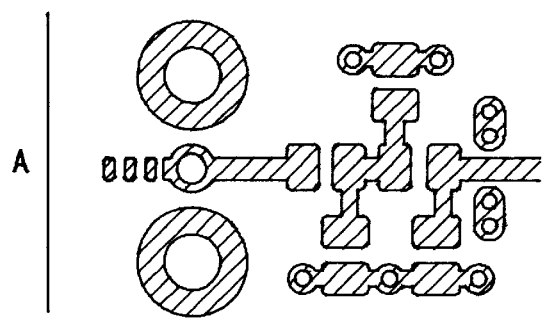
Figure 6B:
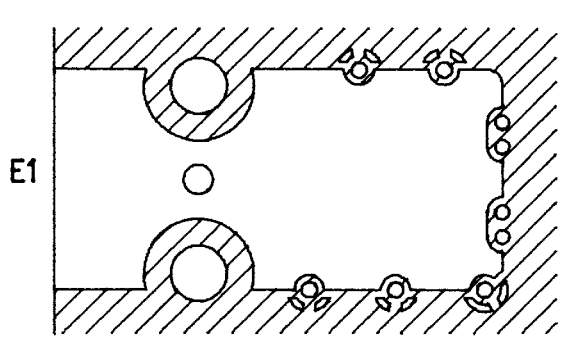
Figure 6C:
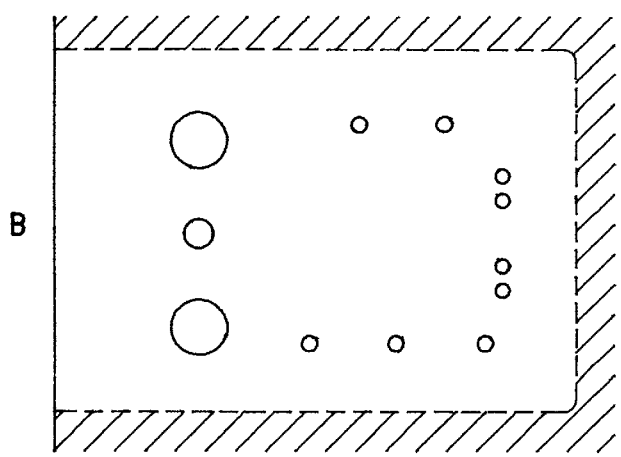
Figure 6D:
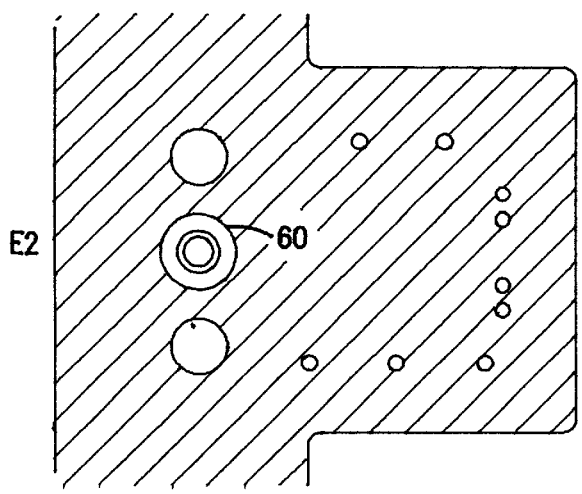

FIGS. 6A–D show the various conductive surfaces or planes shown in FIG. 5A in smaller scale.

Figure 1:
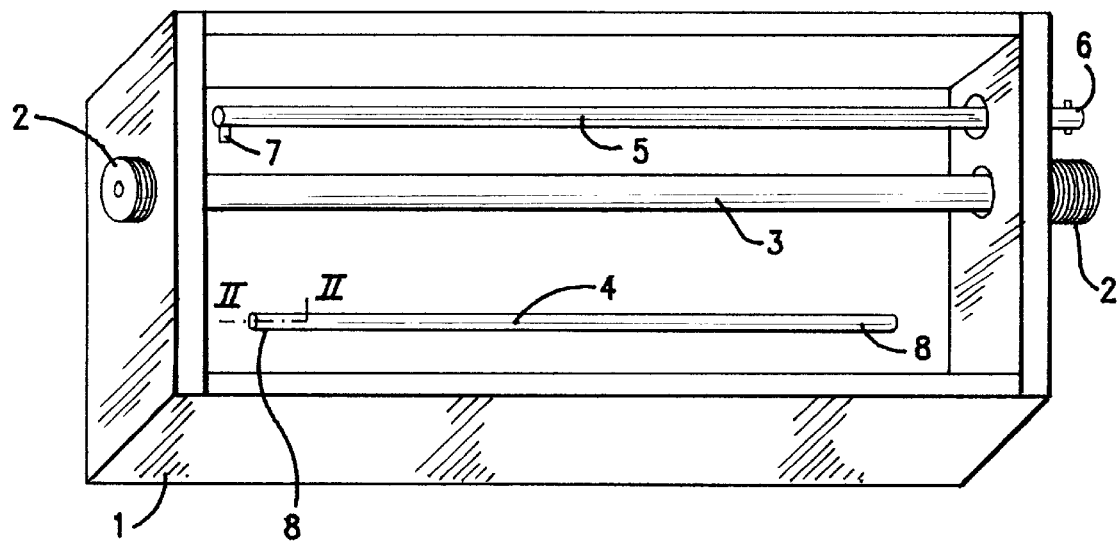
FIG. 1 is a schematic illustration of a measuring line with an open cavity and a directional coupler in accordance with the invention, and a measuring probe.

FIG. 1 illustrates an opened measuring line, including a box 1 which at the ends has two coaxial contacts 2 whose central conductors are joined to a centre conductor 3 which forms in the enclosed cavity, or hollow conductor, together with the broad sides of the box a slab line which is adapted to the coaxial conductors (not shown) to be connected. In the case of an impedance of 50 ohms, the centre conductor may have a diameter of 5 mm.

A symmetric directional coupler 4 is spaced above the bottom wall, said coupler having the form of a rod of 3 mm in diameter meaning an impedance of 75 ohms and a coupling effect of roughly −38 dB.

A test line 5 is mounted on the opposite side of the central conductor and has a matching resistor 7 connected directly to the broad wall and includes a through-extending coaxial contact 6 for connection to a measuring circuit.

Figure 2:
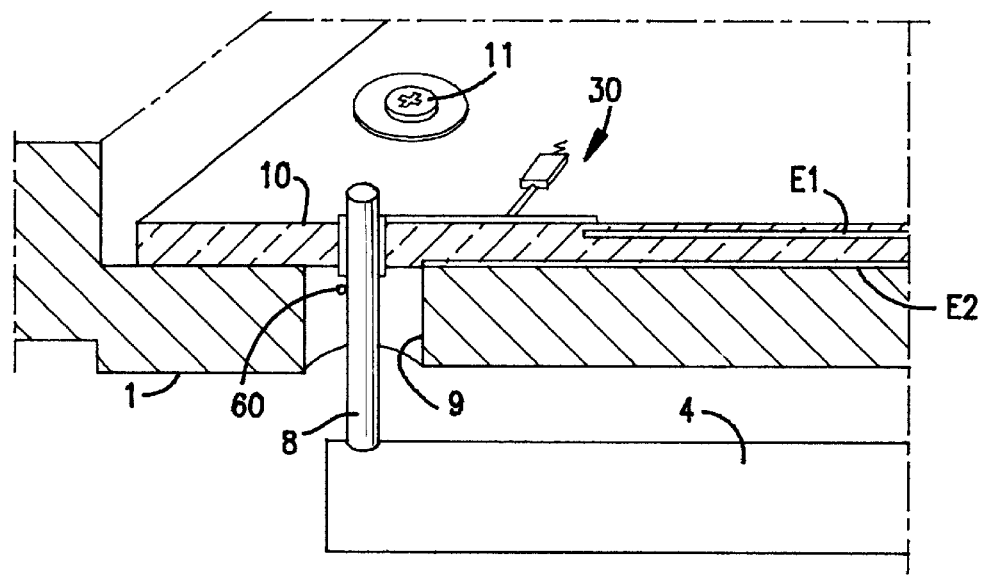
FIG. 2 is a sectional view taken on the line II—II in FIG. 1 and illustrates in detail the fitting of one end of the directional coupler in the cavity.

FIG. 2 shows one terminal connection of the directional coupler 4 connected to an external circuit board 10 through the medium of a short carrier cylinder 8 extending through a hole 9 in the wall. The illustrated circuit board includes a microstrip, as described below. Only a very short length of the carrier cylinder 8 is less well adapted or matched, due to the fact that the diameter of the hole 9 is adapted to the diameter of the cylinder 8.

Figure 3:
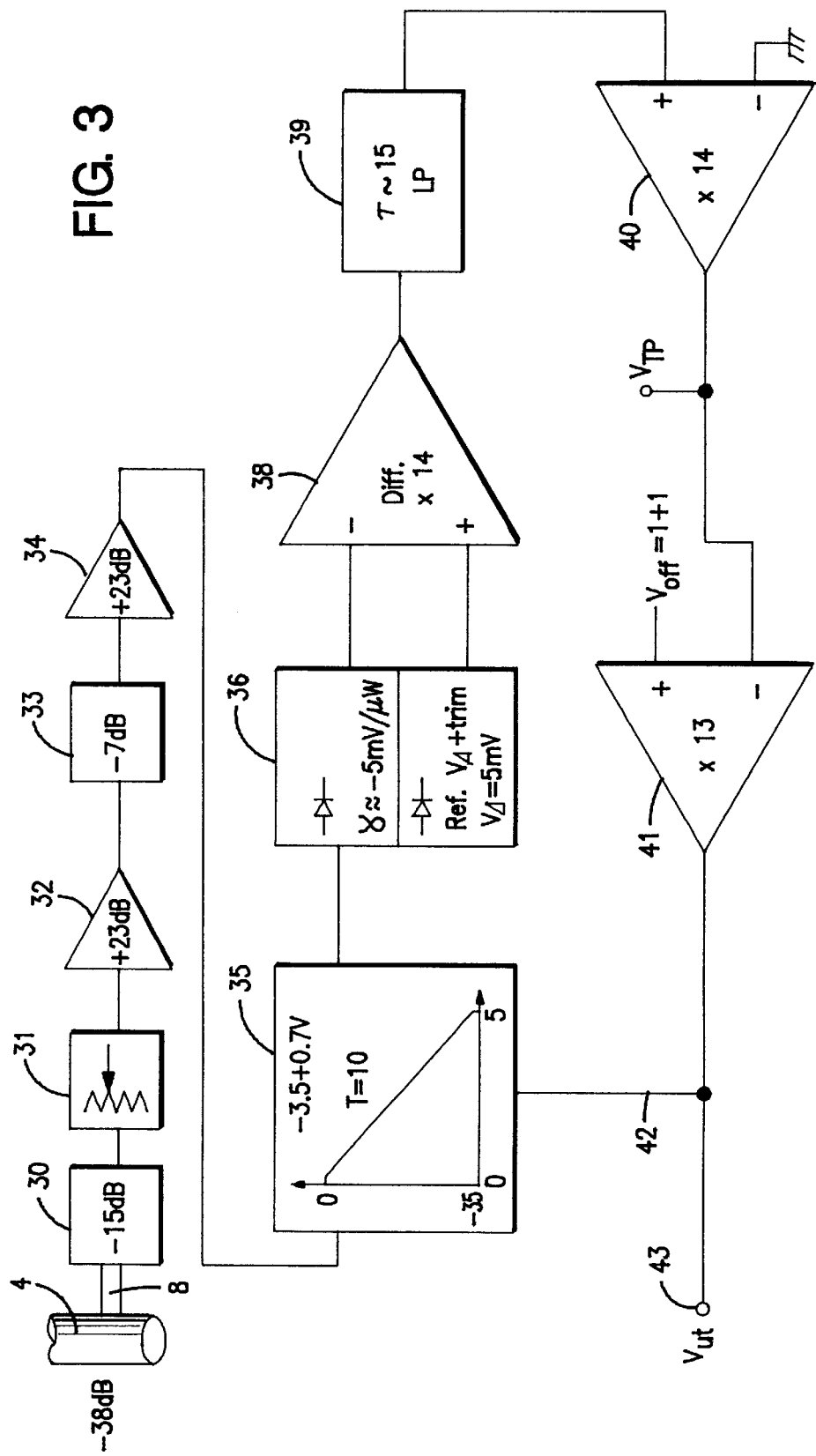
FIG. 3 is a block schematic which illustrates one of two measuring circuits.
Figure 4:
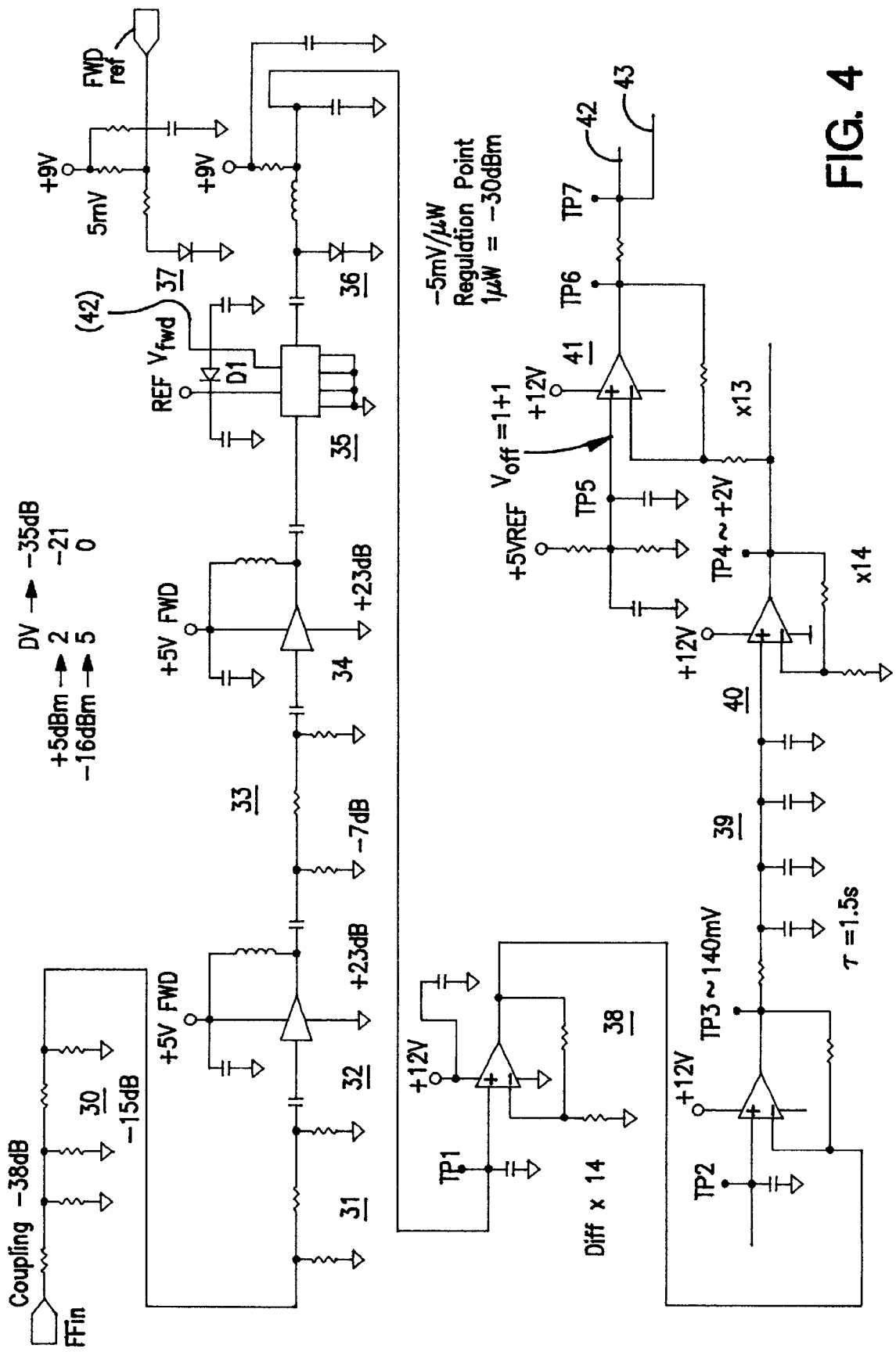
FIG. 4 is a conventional circuit diagram illustrating one of two measuring circuits.

As FIG. 4 illustrates components used on the circuit board 10 (FIG. 2), it may be appropriate to read FIGS. 3 and 4 together. As before mentioned, energy is conducted from respective ends of the directional coupler 4 to a circuit board that has a first attenuation circuit as well as an impedance transformer 30 with an attenuation of 15 dB, followed by a second attenuator 31 which although marked as being adjustable is in practice set in manufacture by appropriate component selection to achieve normalization and compensation of manufacturing tolerances. There then follow two amplifiers 32, 34, which are separated by an attenuator to prevent self-oscillation. The thus amplified power signal is now conducted to a voltage-controlled attenuator 35 (AT-109 from M/A-COM, Lowell, U.S.A.). This component is based on field effect transistors and is able to attenuate frequencies of between 0.5 and 2 GHz by between 0 and −35 dB and is generally linear, expressed in dB/V. There then follows a detector diode 36 with associated filter. A similar diode 37 is provided by the side of the diode 36 and is supplied with direct current as like as is possible, which results in a reference voltage Fwd ref, and the two voltages are each delivered to a respective input on differential amplifier 38, thereby obtaining temperature compensation for the detection. The temperature compensated signal thus obtained is passed to further amplifiers 40 and 41 via a lowpass filter and the output signal Vfwd is fed back to the voltage-controlled attenuator 35. The diode D1 (FIG. 4) prevents the control voltage of the voltage-controlled attenuator from becoming higher than its supply voltage and therefore protects the attenuator. The output voltage will now be a logarithmic measure of the power delivered by the directional coupler.

Although attenuation of the voltage-controlled attenuator is monotonously dependent on its control voltage, it is not fully linear but can exhibit a linearity error in the order of ±1 dB in relation to absolute linearity. Consequently, it is suitable to include a compensation factor in subsequent evaluation circuits, in the form of a look-up table for instance. Since such evaluation circuits are well known to the person skilled in this art, they will not be described in detail here.

A fully decisive part of the invention lies in the optimized adaptation of the ends of the directional coupler which enables only one propagation direction to be actually measured at both ends. The manufactured embodiment will therefore be described thoroughly in detail, although it will be understood that this embodiment does not limit the scope of the invention since, when studying the embodiment, the person skilled in this art will realize that many equivalent variations and modifications are conceivable.

FIG. 5A shows part of the circuit board 10 (FIG. 2) that contains the attenuating and impedance-transforming circuit 30, this illustration being drawn roughly to a scale of 10:1. The full lines denote conductors and solder pads in the uppermost layer of a standard epoxy-board, or card, having four conductive layers, type FR4. The positions of the layers are shown in the sectioned view of FIG. 5B, starting from the top with a signal conductor layer A, followed immediately by a first earth plane layer E1, a second conductor layer B and a second earth plane layer E2. The configuration of the various layers has been shown in a smaller scale in FIGS. 6A–D within the region of the attenuating and impedance-transforming circuit.

It will be seen from the Figures that layer A includes the carrier cylinder 8 (full lines in FIG. 6A) and that the cylinder is soldered to a first microstrip-conductor which has a width of 0.8 mm as evident from the Figure. Only the earth plane E2 is active over the whole of the sectioned areas, while remaining inner conductor layers are removed, as will be seen from FIG. 6B (the layer E1), FIG. 6C (the layer B) and FIG. 6D (the layer E2). The impedance is then 75 ohms. The through-extending carrier cylinder 8 enters from beneath through a circular opening 60 in the earth plane E2 (FIG. 6D), and passes beyond two through-penetrating screw fasteners 11 (one of which is shown in FIG. 2) which pass through the earth pads 12 via holes 11' and are screwed tightly into box 1 and therewith ensure a conductor impedance of 75 ohms. The rounded rectangles P shown in FIG. 5A consist of tin-coated surfaces on which resistors are surface-mounted (FIG. 4), the values of which are also shown in FIG. 5A. The resistors are surface-mounted resistors of the type/size 0805, meaning that the resistors have a width of 1.25 mm among other things. FIG. 5A also gives the widths of the intermediate microstrip conductors and the lengths of the adapted connection conductors. The various conductors are therewith adapted and essentially reflection-free.

The two earth planes E1 and E2 are mutually joined by screws located in the holes 11', said holes being plated, as are also the edges of the opening in the earth plane El (FIG. 6B) by through-plated holes which also join with rings 50 and pads 51. The small recesses around the holes 50 in the earth plane E1 (FIG. 6B) are provided with the intention of reducing heat transportation therein as the resistors are soldered in place.

The small pads shown at 52 were originally constructed to enable soldering to be effected on the conductor (stub) in the event of matching being unsatisfactory, although this was found to be unnecessary in the case of the practical embodiment.

Tests carried out on the constructed measuring line within the intended frequency range of 800–960 MHz showed a loss of less than 0.1 dB, VSWR introduced below 1.1:1, and could transport 1,000 W without being destroyed. The power measuring range was 0.2–600 W (dynamic interval 35 dB). Directivity for the combination as a whole was better than 30 dB. The invention can also be applied at other chosen frequency bands, for instance around 1,800 MHz.

I claim:

1. In a measuring line for a coaxial conductor for determining energy throughflow and standing-wave ratio, comprising two coaxial connectors (2) having an impedance adapted for a coaxial conductor; an intermediate hollow conductor comprising an inner conductor (3) connected to the center conductor of the coaxial connectors and which is matched with said impedance; directional coupler means in said hollow conductor for taking-out two electric signals each corresponding to a respective propagation direction of electric waves between the coaxial connectors; and a detector circuit for respective electric signals, said detector circuits functioning to deliver incoming signals to obtain the measurement values of the energies of respective propagation directions; the improvement wherein the directional coupler means comprise a single directional coupler (4) which is mounted within the hollow conductor and parallel with its inner conductor (3) and which has symmetrically disposed branch lines (8) which are drawn through openings (9) in a wall of the hollow conductor and each of which extends to a respective strip conductor in a circuit board (10) mounted externally of said wall, wherein respective branch lines (8) and strip conductors have a matched impedance which is higher than the impedance of the coaxial conductor wherein the strip conductors are connected to inputs of attenuating and impedance-transforming circuits which inputs are adapted to said higher impedance and have outputs which are adapted to a lower impedance than said attenuating and impedance-transforming circuits and which are connected to strip conductors, said outputs being connected to said detector circuits.

2. A measuring line according to claim 1, wherein said circuit board at the branch lines (8) and the attenuating and impedance-transforming circuits (30) presents a deeper earth plane (E2) in relation to a said conductor placed on the upper side of the circuit board (10), wherein said earth plane (E2) is connected with an earth plane (E1) located nearer the upper side of the circuit board and active in other parts of said board, thereby obtaining impedance matching for difference impedances.

3. A measuring line according to claim 1 wherein each of the detector circuits includes a respective voltage-controlled attenuator (34) having an input, an output and a voltage-controlled input (42), a rectifying diode (36), an amplifier (38, 40, 41) and a lowpass filter (39), wherein the input signal conducted from respective attenuating and impedance-transforming circuits is applied to the input of the voltage-controlled attenuator (35), the output of which is connected to the rectifying diode (36), whose rectified signal is passed via the amplifier (38, 40, 41) and the lowpass filter to the control-voltage input (42) of the voltage-controlled attenuator and to an output for respective detector circuits whose output signals constitute logarithmic measurements of the energies of the directional coupler (4) in respective directions.

4. A measuring line according to claim 1, wherein the hollow conductor (1) is a slab-line conductor and the directional coupler (4) is mounted on one side of its inner conductor (3) while a test line (5) is mounted on its opposite side, wherein one end of the test line is earthed with a matching resistor and its other end is deactivated via a coaxial connection (6).

5. A measuring line according to claim 2, wherein said cylindrical branch lines (8) are drawn out through holes in the outer walls of the hollow conductor, said holes having impedance adapted diameters, and pass through the circuit board with impedance matching between two earthed posts (11) drawn through the circuit board, and up to a said strip conductor that is a microstrip in the upper plane or surface (A), which together with the lower earth plane (E2) gives the same impedance as the impedance of the directional coupler and which leads to a voltage divider (R51-55) laid out in microstrip-technique with an input impedance which coincides with the impedance of the directional coupler, and an output conductor in microstrip coacting with the upper earth plane (E1) which has a lower output impedance.

6. A measuring line according to claim 5, wherein the directional coupler impedance is 60–90 ohms, and has a coupling effect of 35–55 dB, and wherein the attenuating circuit (30) has an attenuation of 10–20 dB, and the output of the attenuating circuit has an output impedance of about 50 ohms.

7. A measuring line according to claim 3, wherein a reference diode (37; D28) supplied with fixed voltage functions to deliver a reference signal which is coupled to one input of a differential amplifier (38), the output signal from the detector diode (36) being coupled to the other input of said differential amplifier.

* * * * *